United States Patent
Sacchetto et al.

(10) Patent No.: US 6,802,652 B1
(45) Date of Patent: Oct. 12, 2004

(54) RECESSED CABLE MANAGEMENT ASSEMBLY

(75) Inventors: Paolo Sacchetto, Sunnyvale, CA (US); Ralph T. Hofmeister, Los Altos, CA (US); Narasinha Parasnis, Sunnyvale, CA (US)

(73) Assignee: Ciena Corporation, Linthicum, MD (US)

( * ) Notice: Subject to any disclaimer, the term of this patent is extended or adjusted under 35 U.S.C. 154(b) by 13 days.

(21) Appl. No.: 10/264,843

(22) Filed: Oct. 4, 2002

(51) Int. Cl.[7] .................................................. G02B 6/38
(52) U.S. Cl. ........................................ 385/59; 385/135
(58) Field of Search ................................ 385/135, 134, 385/147, 136, 137, 59; 379/438

(56) References Cited

U.S. PATENT DOCUMENTS

| | | | | |
|---|---|---|---|---|
| 4,622,609 A | * | 11/1986 | Barton | ..................... 360/266.6 |
| 5,655,044 A | * | 8/1997 | Finzel et al. | ................ 385/135 |
| 5,924,885 A | * | 7/1999 | Pacher | ...................... 439/352 |
| 6,580,866 B2 | * | 6/2003 | Daoud et al. | ............... 385/135 |
| 6,591,053 B2 | * | 7/2003 | Fritz | .......................... 385/135 |
| 2002/0172489 A1 | * | 11/2002 | Daoud et al. | ............... 385/135 |
| 2003/0048999 A1 | * | 3/2003 | Imabayashi et al. | .......... 385/88 |

* cited by examiner

Primary Examiner—J. F. Duverne
(74) Attorney, Agent, or Firm—Michael R. Cammarata; David A. Fox

(57) ABSTRACT

A recessed cable management assembly for use in an interconnect assembly. The cable management assembly includes a cassette having a spool for receiving and retaining a length of a cable. A substrate includes an interconnect connector which is coupled to the cable. The substrate includes a cut-out sized to receive the cable management assembly such that the cable management assembly is recessed within the substrate.

25 Claims, 9 Drawing Sheets

RECESSED CABLE MANAGEMENT ASSEMBLY

BACKGROUND OF THE INVENTION

1. Field of Invention

The invention relates generally to cable management and in particular to a recessed cable management assembly for use in an interconnect assembly.

2. Description of Related Art

Cable managers are used in a number of applications to retain and manage cables (e.g., copper twisted pair cable, fiber optic cable, coaxial cable). In some applications, the cable manager is mounted on a substrate such as a printed circuit board that is plugged into an interconnect such as motherboard or a backplane. Existing cable managers have significant size that restricts the number of printed circuit boards that may be mated with the interconnect.

BRIEF DESCRIPTION OF THE DRAWINGS

Embodiments of the invention will become more fully understood from the detailed description given hereinbelow and the accompanying drawings which are given by way of illustration only, and thus are not limitative of the present invention, and wherein.

DETAILED DESCRIPTION OF INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The invention relates to management of cable and identifies various components "coupled" to the cable. Such "coupled" devices are not necessarily directly connected to one another and may be separated by intermediate components or devices. Likewise, the expression "connected" as used herein is a relative term and does not require a direct physical connection.

Figure 1:
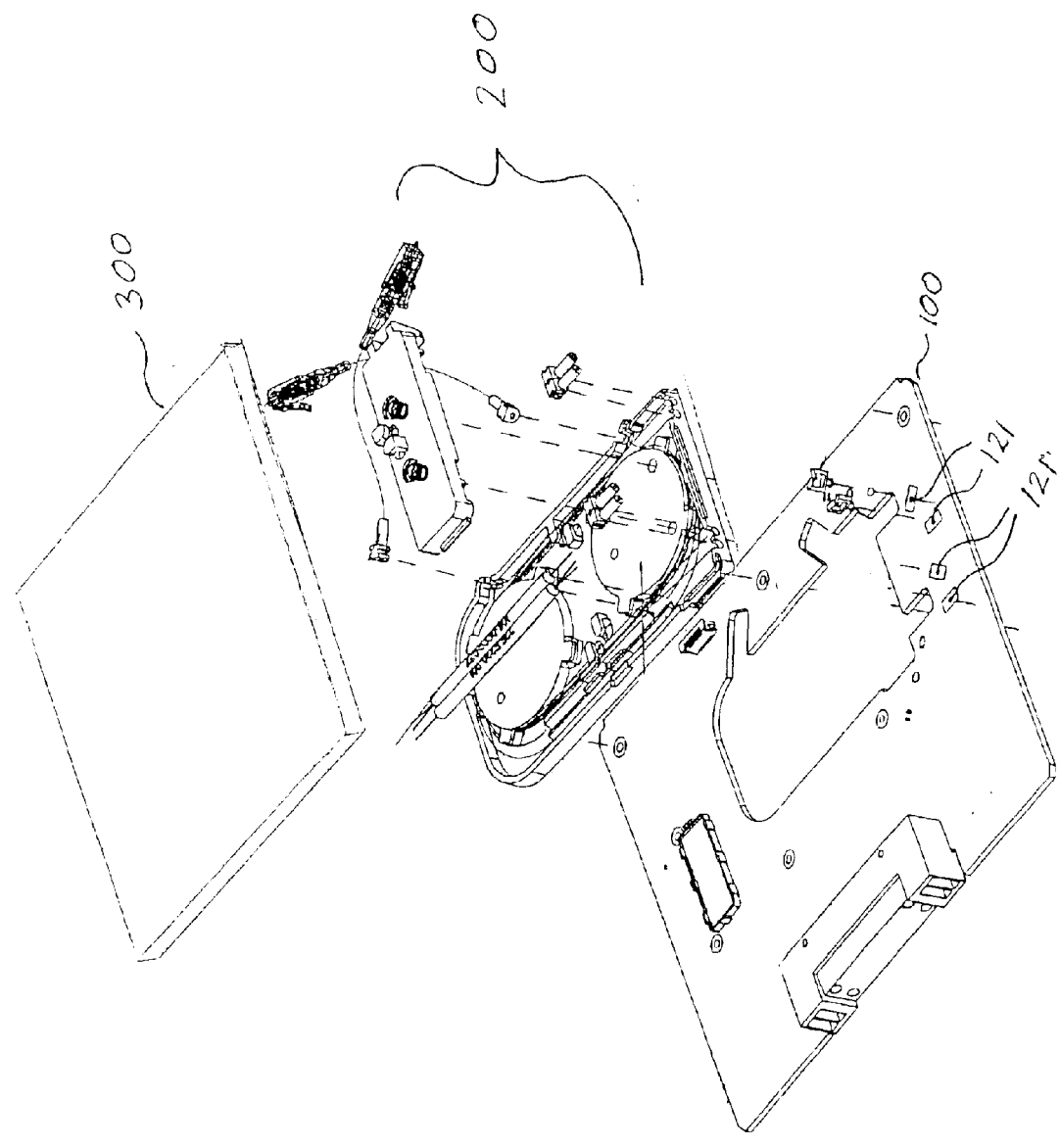
FIG. 1 is an exploded perspective view of an interconnect assembly in an embodiment of the invention.

FIG. 1 is an exploded perspective view of an interconnect assembly 10 in an embodiment of the invention. The interconnect assembly 10 includes a substrate 100 having a cable management assembly 200 recessed therein. In one embodiment, the substrate 100 is a printed circuit board including printed circuitry and passive and/or active components. A circuit card 300 is mounted to the substrate 100 on top of the cable management assembly 200 and is connected to one or more cables in the cable management assembly 200 as described in further detail herein. The substrate 100 may provide the connection between circuit card 300 and cable management assembly 200. Substrate 100 may also provide operational connections (e.g., power, ground) to circuit card 300.

The interconnect assembly 10 may be plugged into an interconnect (e.g., backplane or motherboard) designed for multiple interconnect assemblies. The interconnect assemblies may be stacked vertically, or horizontally, in an equipment rack. Recessing the cable management assembly 200 reduces the thickness of the interconnect assembly 10 allowing a higher density of interconnect assemblies 10 to be mated with an interconnect or otherwise placed within an equipment rack/shelf. Reducing the form factor of the interconnect assembly is an important factor particularly in the telecommunications field where the interconnect assemblies support transmit and/or receive circuitry. Thus, a higher density of such assemblies that is achieved by reducing the form factor of the assemblies translates into a larger number of channels that can be received and/or transmitted within the same equipment rack or shelf. Recessing the cable management assembly 200 also allows unhindered air flow if necessary for cooling circuit card 300.

Figure 2:
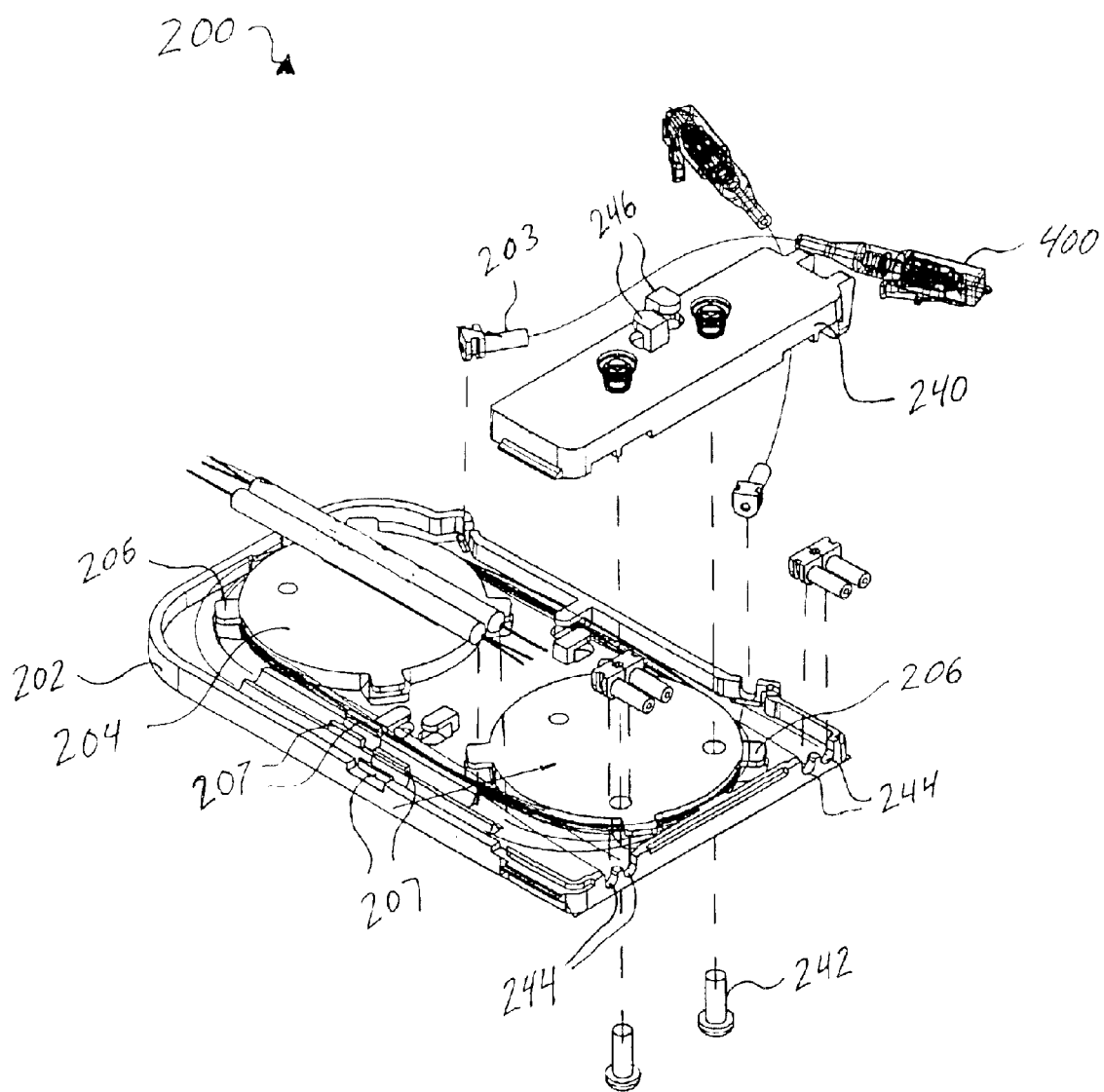
FIG. 2 is an exploded perspective view of a cable management assembly in an embodiment of the invention.
Figure 3:
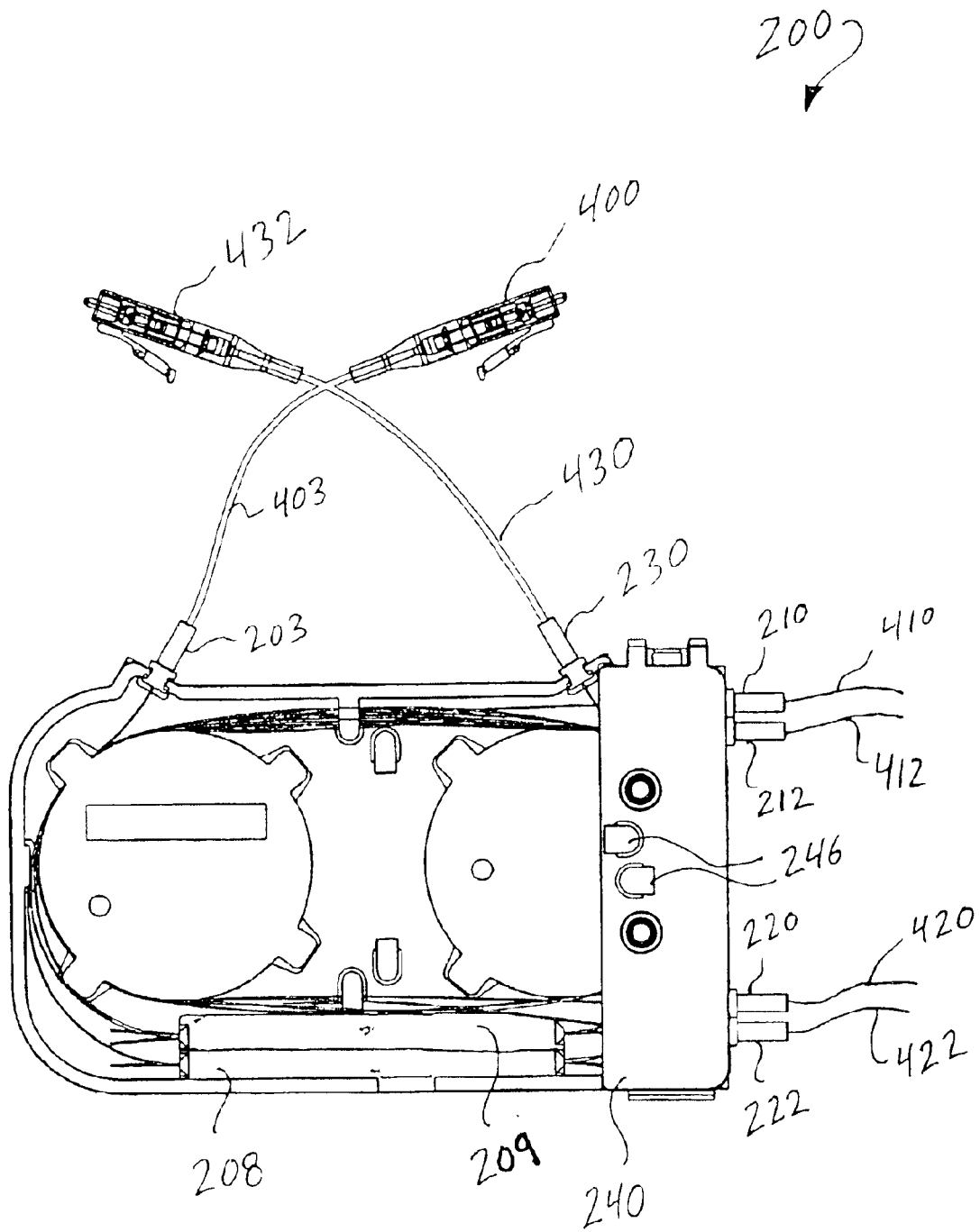
FIG. 3 is a top view of the cable management assembly in an embodiment of the invention.

Referring to FIGS. 2 and 3, cable management assembly 200 includes a cassette 202 having spools 204 for managing cable. In an embodiment of the invention, the cable is fiber optic cable. The spools 204 are circular and include radially projecting tabs 206 around each spool periphery for retaining the cable. The spools 204 preferably have a radius such that the cable is not bent below a minimum bend radius. The spools 204 may be separated by a certain distance to allow for directional changes in spooling fiber inside the cassette 202.

In an embodiment of the invention, the interconnect assembly 10 serves as an optical transceiver. The signal transmission path begins at a connector 400 connected to a transmission fiber 403. The transmission fiber 403 is jacketed until it enters the cassette 202 through a cable boot 203 and transitions to unjacketed or bare fiber. The cable boot 203 surrounds the fiber and supports the fiber upon entry to the cassette 202. The cable boot 203 is mounted to cassette 202 in a notch formed in a sidewall of the cassette 202.

Using bare transmission fiber 403 in the cassette 202 reduces the size of the fiber and thus the size requirement for cassette 202. The bare transmission fiber 403 is routed around one and/or both spools 204 so that slack fiber is contained by spools 204. The amount of slack in the bare transmission fiber 403 may be dictated by manufacturing techniques and/or the need for slack fiber for service needs.

The bare transmission fiber 403 may then be coupled to an optical device 208. In the example shown in FIGS. 2 and 3, the connector 400 receives a transmission signal having at least two wavelengths, for example, 1310 nm and 1550 nm. The optical device 208 separates the first wavelength (e.g., 1310 nm) from the second wavelength (e.g., 1550 nm) and outputs each wavelength on a separate fiber. The two fibers carrying the two wavelengths are output from the cassette 202 through cable boots 210 and 212. At cable boots 210 and 212, the fibers transition from bare fiber to jacketed fiber. Cable boots 210 and 212 are mounted in notches formed in the sidewall of cassette 202.

The transmission fiber 403, first fiber 410 and second fiber 412 may be referred to generally as a single fiber or cable, despite being split at optical device 208 and being divided into multiple fibers at optical device 208.

First fiber 410 exiting cable boot 210 and second fiber 412 exiting cable boot 212 carry the first wavelength and second wavelength, respectively, for transmission. Fiber 410 is coupled to the substrate 100, either directly or through circuit card 300. Fiber 412 is coupled to the circuit card 300 either directly or through substrate 100. Substrate 100 and circuit card 300 may include circuitry in the form of a transmitter for transmitting the signals on fibers 410 and 412. The transmission signals generated by circuit card 300 and substrate 100 are provided to an interconnect connector 104 (see FIG. 4) that is used to mate the interconnect assembly 10 to an interconnect.

Incoming signals are received at interconnect connector 104 and provided to circuitry such as a receiver on the substrate 100 and a receiver on the circuit card 300. From the substrate 100, the received signal is routed to fiber 420, either directly from substrate 100 or through the circuit card 300. From the circuit card, the received signal is routed to fiber 422, either directly from circuit card 300 or through the substrate 100. As noted previously, the received signal on first fiber 420 corresponds to a first wavelength (e.g., 1310 nm) and the received signal on second fiber 422 corresponds to a second wavelength (1550 nm). First fiber 420 and second fiber 422 are routed through cable boots 220 and 222, respectively and are input to optical device 209. The first fiber 420 and second fiber 422 transition from jacketed fiber to bare fiber at cable boots 220 and 222. Cable boots 220 and 222 are mounted in notches formed in the sidewall of cassette 202.

Optical device 209 is a coupler that combines the first wavelength and second wavelength onto a single, bare reception fiber 430 that is routed around one or both spools 204. Again, the amount of slack in reception fiber 430 around spools 204 may be dictated by manufacturing techniques and/or the need for slack fiber for service needs. Manufacturing techniques that benefit from slack fiber being available include fiber splicing in which fiber lengths or components are spliced together using a conventional fiber splicing machine. In other words, the splice machine operator typically needs a certain length of fiber in order to perform the splice.

The reception fiber 430, first fiber 420 and second fiber 422 may be referred to generally as a single fiber or cable, despite being combined into a single cable at optical device 209.

Cassette 202 includes retainers 207 for securing the optical devices 208 and 209 to the cassette 202. The retainers 207 may be formed integrally with the cassette (e.g., co-molded in plastic) or may be separate components. The retainers 207 are sized and shaped to receive the optical devices 208 and 209 and secure the optical devices 208 and 209 to the cassette 202 through mechanical engagement.

In the example of FIGS. 2 and 3, the optical devices 208 and 209 are passive couplers. It is understood that other optical devices may be employed including active optical devices.

The bare reception fiber 430 exits cassette 200 at cable boot 230 and transitions to jacketed fiber. Cable boot 230 is mounted in a notch in a sidewall of cassette 202. Reception fiber 430 is connected to a connector 432 to provide the reception signal to a recipient.

Cable management assembly 200 may include a cap 240 that covers a portion of the cassette 202. The cap 240 is secured to the cassette 202 by fasteners 242 and includes notches 244 (see FIG. 2) for accommodating and retaining cable boots 210, 212, 220 and 222. It is understood that the cap 240 can also be secured to the cassette 202 via other means such as snaps and living hinges, pushpins etc. As disclosed in further detail with reference to FIG. 6, the cap 240, if needed, covers the portion of the cassette 202 that is not covered by circuit card 300.

Figure 4:
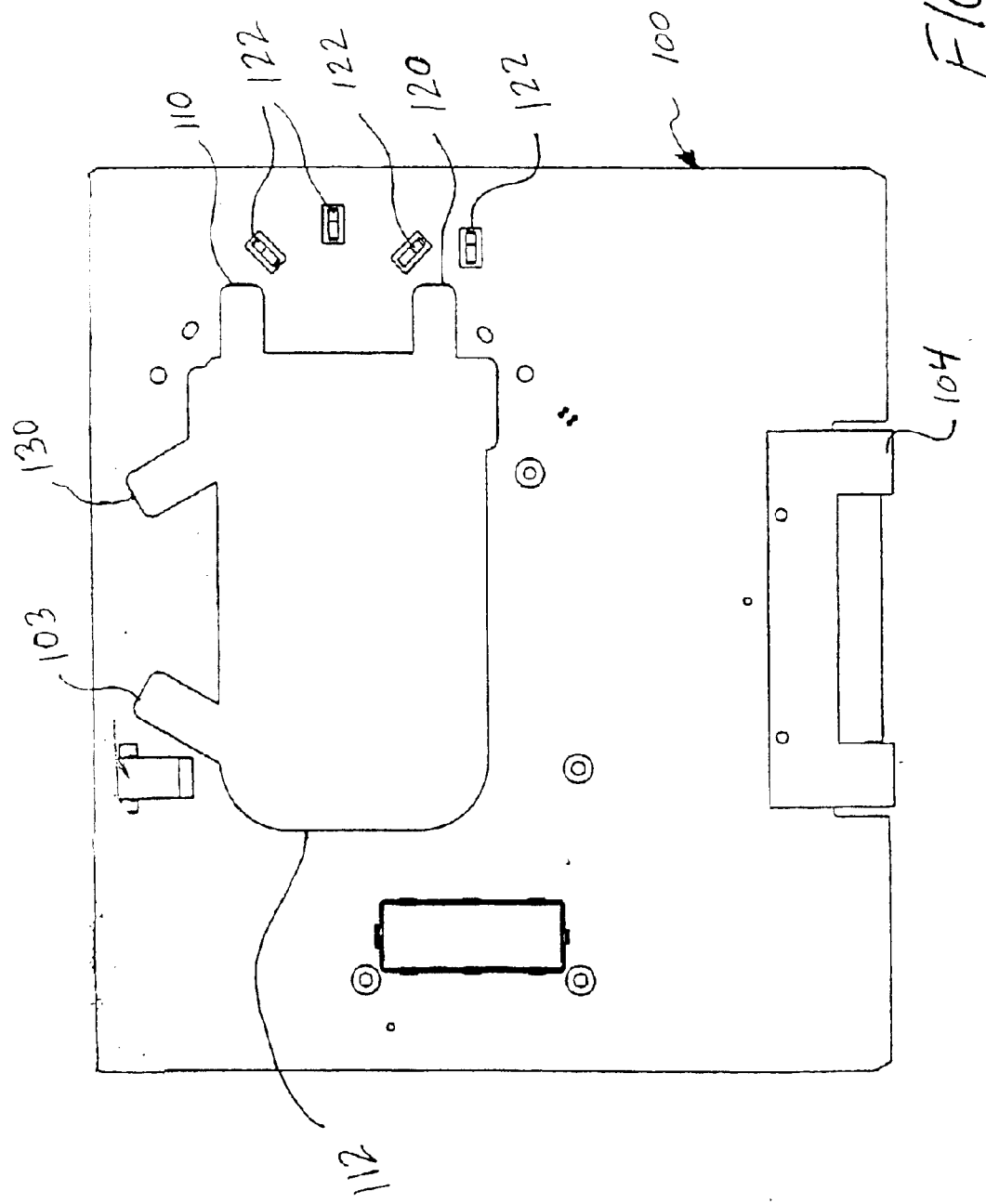
FIG. 4 is a top view of a substrate in an embodiment of the invention.

FIG. 4 is a top view of the substrate 100 in an embodiment of the invention. The substrate 100 may be a printed circuit board including electrical and optical components for providing the transceiver function described above. The substrate 100 includes an interconnect connector 104 for mating the interconnect assembly 10 with an interconnect such as a backplane or motherboard. The substrate 100 includes a cut-out 112 sized to receive the cable management assembly 200 such that the cable management assembly 200 is recessed with substrate 100. Cut-out 112 includes cut-out extension 103 for receiving cable boot 203, cut-out extension 130 for receiving cable boot 230, cut-out extension 110 for receiving cable boots 210 and 212, and cut-out extension 120 for receiving cable boots 220 and 222.

Figure 5:
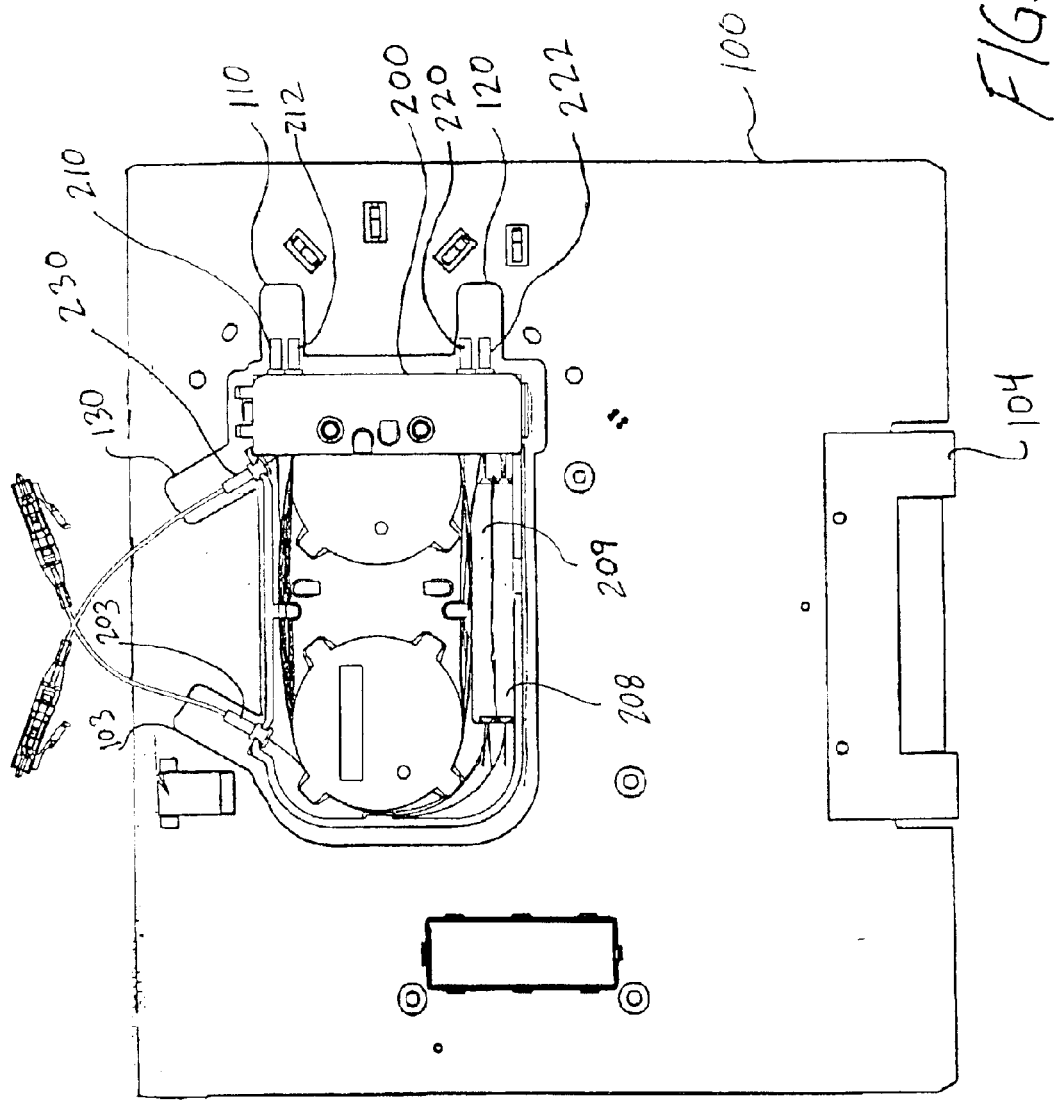
FIG. 5 is a top view of the cable management assembly recessed in the substrate in an embodiment of the invention.

FIG. 5 is a top view of the cable management assembly 200 mounted and recessed within the substrate 100. The cable management assembly 200 is secured to the substrate 100 using fasteners and supports as needed. The opening extensions 103, 130, 110 and 120 receive cable boots 203, 230, 210/212 and 220/222 respectively, and provide a transition area for cable to enter the cassette 202.

Figure 6:
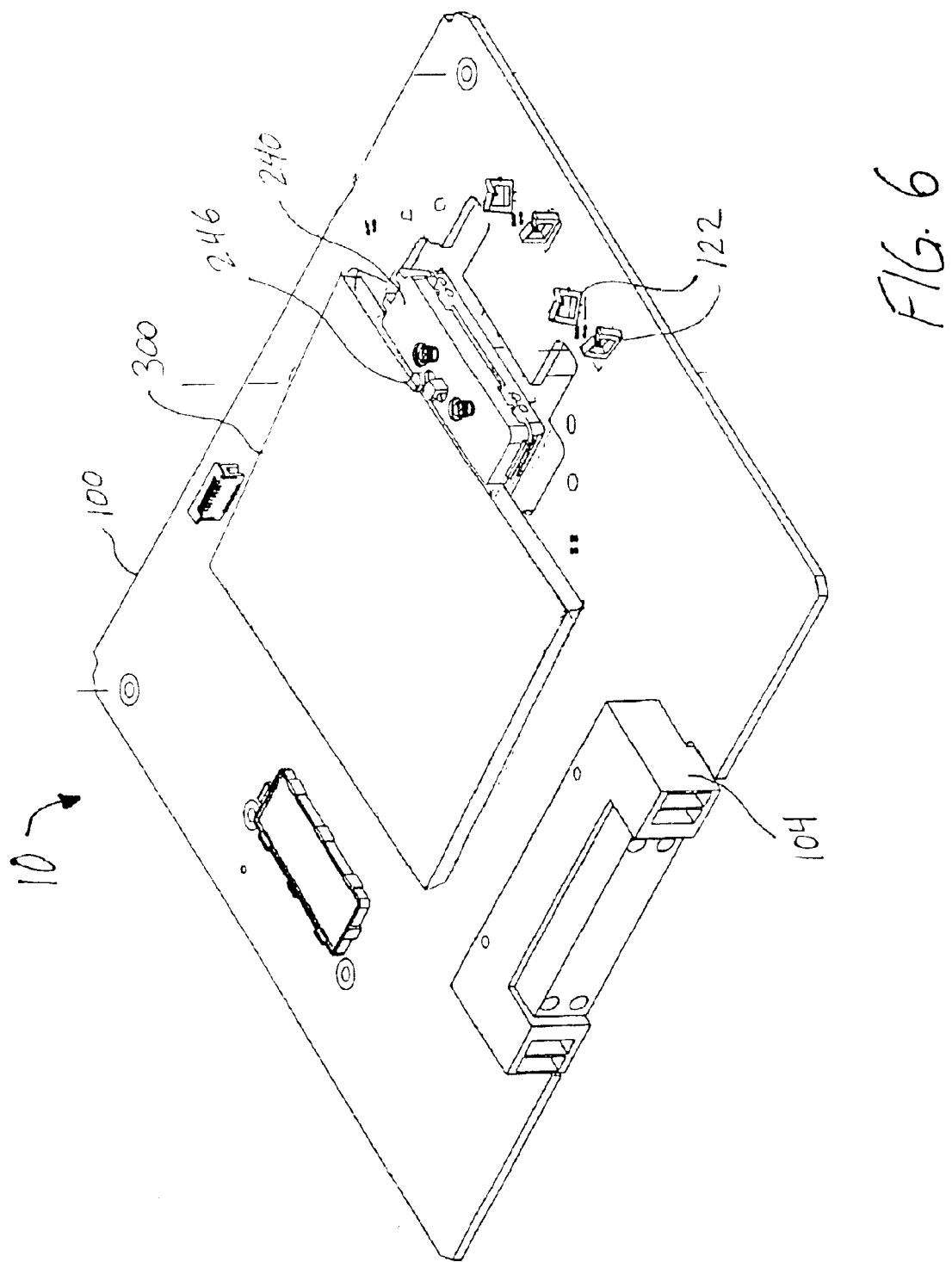
FIG. 6 is a perspective view of the interconnect assembly of FIG. 1.
Figure 6A:
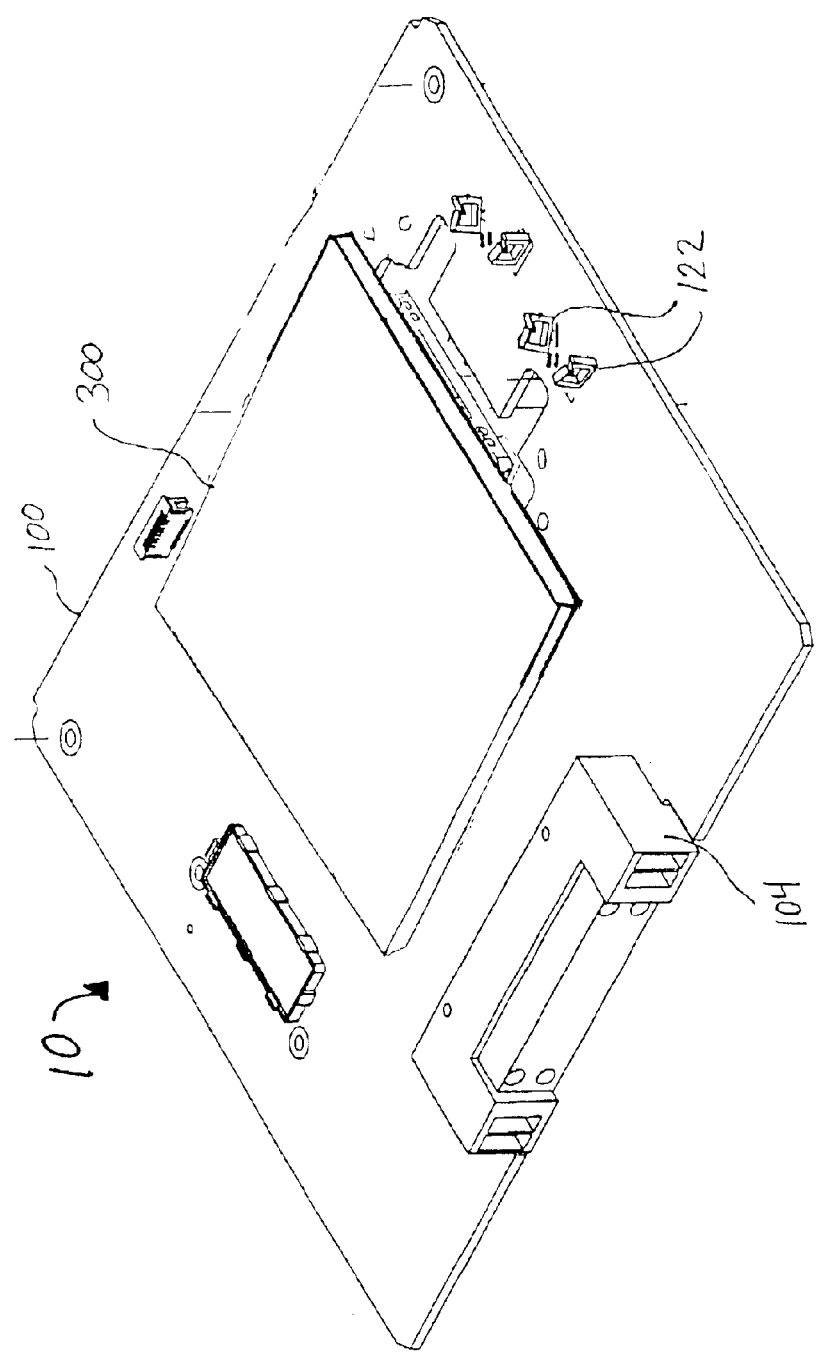
FIG. 6A is a perspective view of an alternate interconnect assembly with a circuit card covering the entire cable management assembly.

FIG. 6 is a perspective view of the interconnect assembly 10. As shown in FIG. 6, the circuit card 300 covers a portion of the cassette 202. This protects the bare transmission fiber 403 and the bare reception fiber 430 positioned around spools 204. Cap 240 is used to cover any portion of cassette 202 that is not covered by circuit card 300. The cap 240 abuts against the circuit card 300 to cover cassette 202. It is understood that the cap 204 may be unnecessary if the circuit card 300 covers the entire cassette 202. FIG. 6A shows an alternate interconnect assembly 10' in which the circuit card 300 covers the entire cassette 202. Alternatively, the cap 240 may cover the entire cassette 202 if the circuit card 300 does not cover any portion of the cassette 202.

Fibers exiting cable boots 210, 212, 220 and 222 may also require some amount of slack in order to facilitate manufacturing and/or service needs. To accommodate slack in these fibers, cap 240 includes a cable management clip 246 that provides a location for securing fibers. The cable management clip 246 may be integrally formed with cap 240 (e.g., co-molded from plastic). Alternatively, the cap 240 may include an opening that receives a separate cable management clip.

The substrate 100 includes openings 121 for receiving cable management clips 122. Cable management clips 246 and 122 retain loops of fiber exiting cable boots 110, 112, 210 and 212 and are arranged in a generally circular pattern. The positioning of the cable management clips 246 and 122 is such that the fiber is kept above a minimum bend radius.

Figure 7:
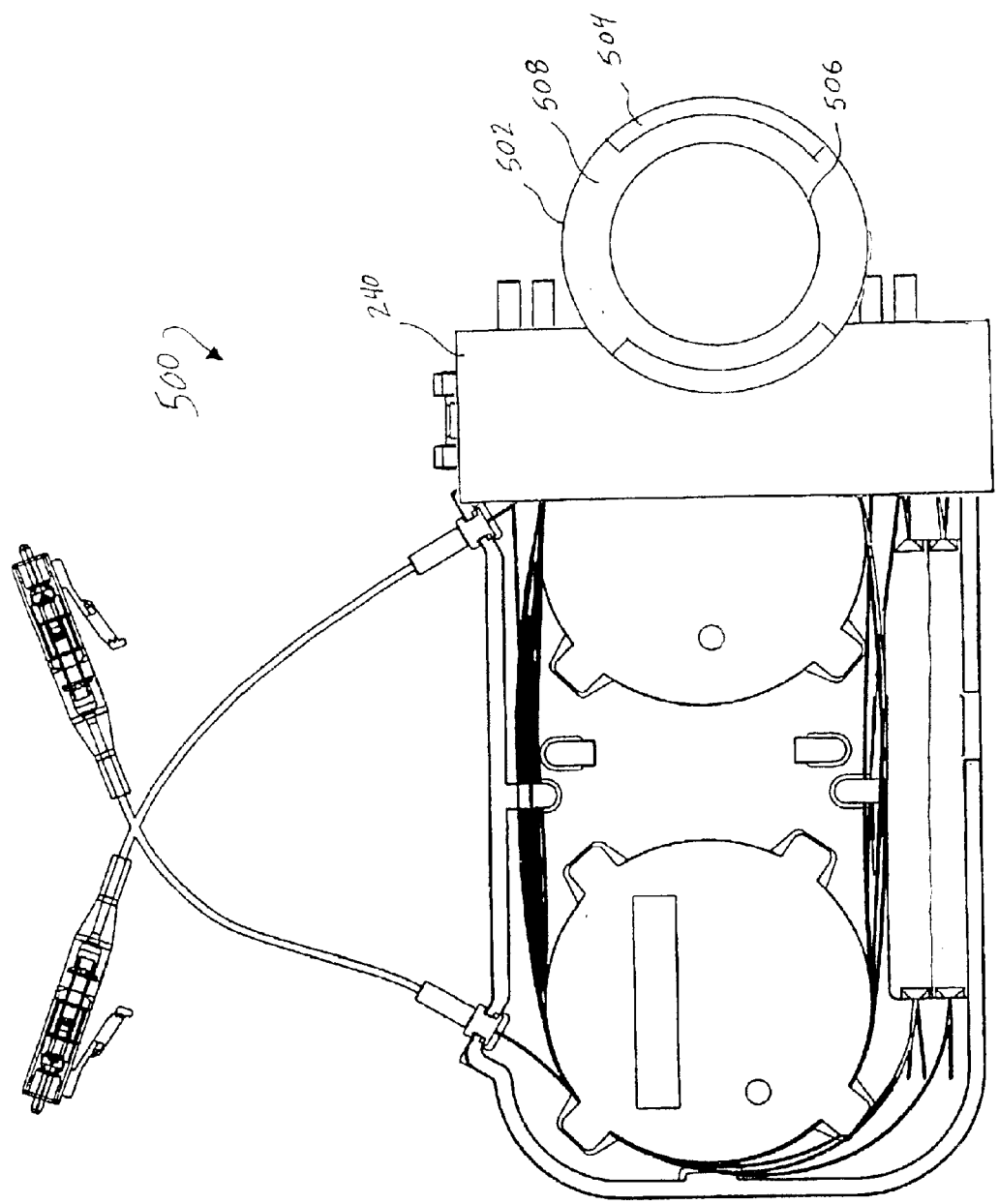
FIG. 7 is a top view of a cable management assembly in an alternate embodiment.

FIG. 7 is a top view of an alternate cable management assembly 500. Cable management assembly 500 is similar to cable management assembly 200 with the addition of cap tray 502. Cap 240 includes a cap tray 502 for retaining slack fiber exiting cable boots 110, 112, 220 and 222. Cap tray 502 includes outer sidewalls 504 and an inner raised hub 506 which define a trough 508. Excess slack fiber may be retained in trough 508. Hub 506 and/or sidewalls 508 may include tabs extending radially toward trough 508 to retain fiber in the trough 508. Cap tray 502 may be secured to cap 240 using known techniques (e.g., fasteners) or may be formed integrally with cap 240 (e.g., co-molded from plastic).

Figure 8:
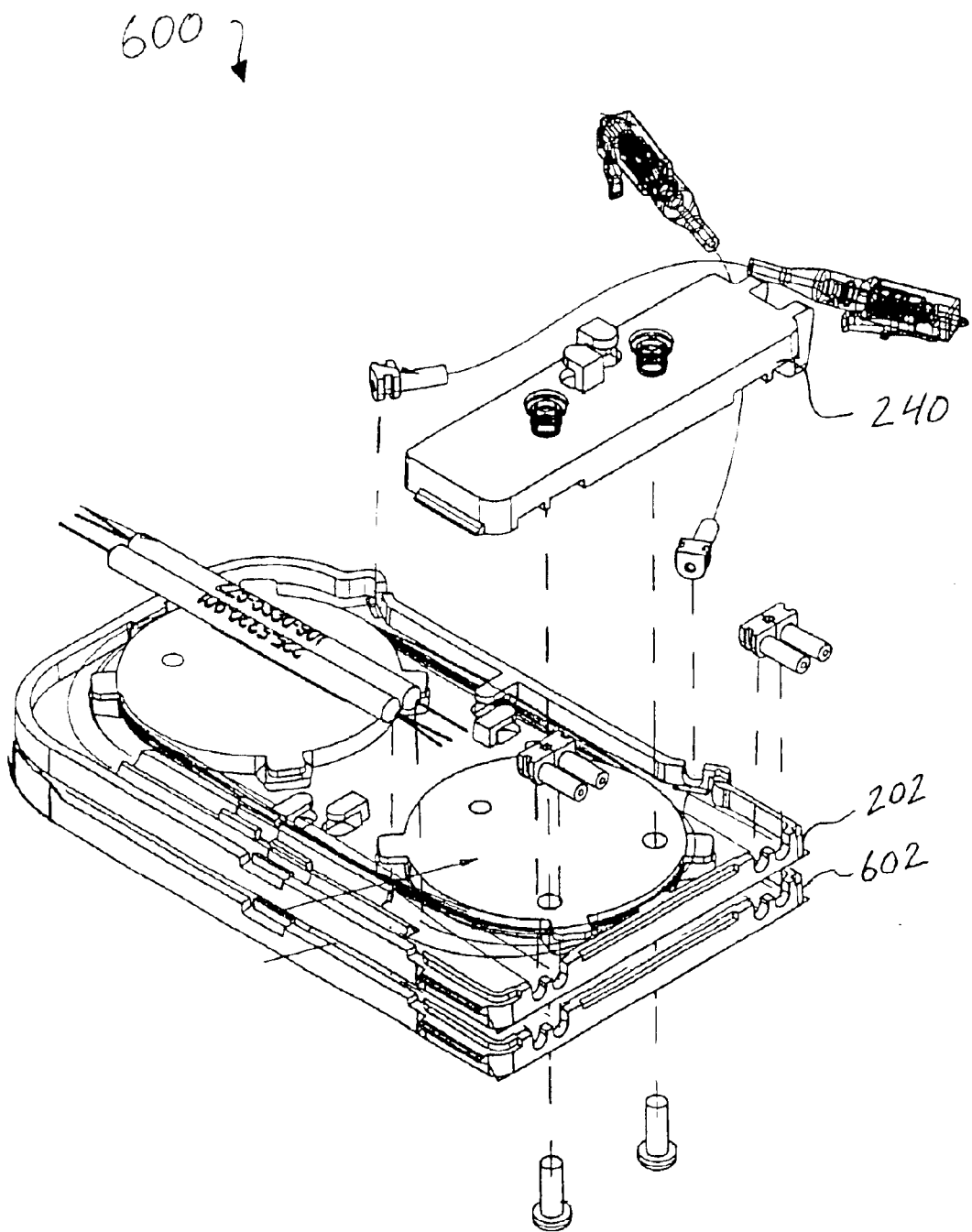
FIG. 8 is a perspective view of a cable management assembly in an alternate embodiment of the invention.

FIG. 8 is a perspective view of a cable management assembly 600 in an alternate embodiment of the invention. The cable management assembly 600 includes a plurality of stacked cassettes 202 and 602. The stacked cassettes 202 and 602 may be used to handle larger numbers of cables. Cassette 202 covers cassette 602 to protect bare fiber in cassette 602. Cassette 602 may be secured to cassette 202 using fasteners or other known techniques. Cassette 202 may be covered by one of or a combination of circuit card 300 and cap 240. Stacked cassettes 202 and 602 are recessed into substrate 100 as described above. It is understood that more than two cassettes may be stacked and the embodiment of FIG. 8 is exemplary.

The cable management assembly 200 has been described with reference to optical fiber and optical devices. It is understood that these are exemplary embodiments and the cable management assembly 200 may be used to contain electric cables and electric passive/active devices. Additionally, a combination of electrical cables, optical cables, electrical devices and optical devices may be employed in the cable management assembly 200. Thus, the invention is not limited to any one application.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. An interconnect assembly comprising:
   a cable management assembly including a cassette having a spool for receiving and retaining a length of a cable;
   a substrate including a cut-out sized and shaped to receive said cable management assembly, said cable management assembly being disposed within the cut-out such that said cable management assembly is recessed within said substrate; and
   a circuit card having circuitry coupled to said cable and circuitry coupled to an interconnect connector, said circuit card covering a portion of said cassette.

2. The interconnected assembly of claim 1, said substrate having an interconnect connector coupled to the cable.

3. The interconnect assembly of claim 1 wherein:
   said cable management assembly includes two spools for receiving and retaining said cable.

4. The interconnect assembly of claim 1 wherein:
   said cable is fiber optic cable and said cable management assembly further comprises an optical device coupled to said fiber optic cable.

5. The interconnect assembly of claim 4 wherein:
   said cassette includes a retainer for securing said optical device to said cassette.

6. The interconnect assembly of claim 5 wherein:
   said retainer is integrally formed with said cassette.

7. The interconnect assembly of claim 1 wherein:
   said cable is electric cable and said cable management assembly further comprises an electrical device coupled to said electric cable.

8. The interconnect assembly of claim 7 wherein:
   said cassette includes a retainer for securing said electrical device to said cassette.

9. The interconnect assembly of claim 8 wherein:
   said retainer is integrally formed with said cassette.

10. The interconnect assembly of claim 1 wherein:
    said circuit card covers said cassette.

11. The interconnect assembly of claim 1 wherein:
    said cable management assembly includes a cap covering a further portion of said cassette, said cap abutting said circuit card.

12. The interconnect assembly of claim 1 wherein:
    said cable management assembly includes a cap covering a portion of said cassette.

13. The interconnect assembly of claim 12 wherein:
    said cap includes a cable management clip for managing said cable exiting said cassette.

14. The interconnect assembly of claim 13 wherein:
    said cable management clip is integrally formed with said cap.

15. The interconnect assembly of claim 13 wherein:
    said substrate includes further cable management clips for managing said cable exiting said cassette.

16. The interconnect assembly of claim 12 wherein:
    said cap includes a cap tray for managing said cable exiting said cassette.

17. The interconnect assembly of claim 16 wherein:
    said cap tray is integrally formed with said cap.

18. The interconnect assembly of claim 16 wherein:
    said cap tray includes sidewalls along a cap periphery and a central, raised hub, said sidewalls and said hub defining a trough for receiving and retaining said cable.

19. The interconnect assembly of claim 1 wherein:
    said cable enters said cassette through a cable boot;
    said cut-out including a cut-out extension sized to receive said cable boot.

20. The interconnect assembly of claim 1 wherein:
    said cable management assembly includes a further cassette having a further spool for receiving and retaining a length of a further cable;
    said cassette being stacked upon said further cassette.

21. An interconnect assembly comprising:
    a cable management assembly including a cassette having a spool for receiving and retaining a length of a cable; and
    a substrate including a cut-out, the cut-out being an opening piercing a planar surface of the substrate, the opening being sized and shaped to receive said cable management assembly, said cable management assembly being disposed within the cut-out such that said cable management assembly is recessed within said substrate,
    wherein said cassette is a plurality of cassettes stacked one upon another.

22. The interconnect assembly according to claim 21, wherein:
    said cassette is disposed in a fixed position within the cut-out of the substrate.

23. The interconnect assembly according to claim 21, wherein:
    a lower surface of the cassette is exposed through the opening in the planar surface of the substrate.

24. The interconnect assembly of claim 21, further comprising:
    a circuit card having circuitry coupled to said cable and circuitry coupled to an interconnect connector,
    said circuit card covering a portion of said cassette.

25. The interconnect assembly of claim 1, wherein:
    said cassette is a plurality of cassettes stacked one upon another.

* * * * *